US009553559B2

(12) United States Patent
Sobolewski

(10) Patent No.: US 9,553,559 B2
(45) Date of Patent: Jan. 24, 2017

(54) CONFIGURABLE BIAS TEE

(71) Applicant: Keithley Instruments, Inc., Cleveland, OH (US)

(72) Inventor: Gregory Sobolewski, Brecksville, OH (US)

(73) Assignee: KEITHLEY INSTRUMENTS, INC., Cleveland, OH (US)

( * ) Notice: Subject to any disclaimer, the term of this patent is extended or adjusted under 35 U.S.C. 154(b) by 268 days.

(21) Appl. No.: 14/521,969

(22) Filed: Oct. 23, 2014

(65) Prior Publication Data

US 2015/0270823 A1 Sep. 24, 2015

Related U.S. Application Data

(60) Provisional application No. 61/955,553, filed on Mar. 19, 2014.

(51) Int. Cl.
*G01R 27/02* (2006.01)
*H01P 5/04* (2006.01)
*H03H 7/46* (2006.01)
*H01P 5/00* (2006.01)
*G01R 31/28* (2006.01)
G01R 19/00 (2006.01)
H01P 1/20 (2006.01)
H03H 7/01 (2006.01)

(52) U.S. Cl.
CPC .............. *H03H 7/465* (2013.01); *G01R 19/00* (2013.01); *G01R 27/025* (2013.01); *G01R 31/2822* (2013.01); *H01P 5/00* (2013.01); *H03H 7/46* (2013.01); *G01R 19/0015* (2013.01); *G01R 31/2889* (2013.01); *H01P 1/2007* (2013.01); *H03H 7/0123* (2013.01)

(58) Field of Classification Search
CPC ....... G01R 27/00; G01R 27/02; G01R 27/025; G01R 19/00; G01R 19/0015; G01R 31/2822; G01R 31/2889; H03H 7/00; H03H 7/0123; H03H 7/46; H03H 7/465; H03H 7/48; H03H 7/485; H03H 1/0007; H01P 5/00; H01P 1/2007; H05K 1/0239
USPC .................. 324/600, 602, 609; 333/12, 24 R
See application file for complete search history.

(56) References Cited

U.S. PATENT DOCUMENTS 5,891,746 A 4/1999 Kuchta
6,229,408 B1 5/2001 Jovanovich
6,396,298 B1 * 5/2002 Young ................ G01R 31/2621
324/762.09

(Continued)

OTHER PUBLICATIONS

European Patent Office, Extended European Search Report for Application No. 15159817.4, 6 pages, Munich, Germany.

*Primary Examiner* — Hoai-An D Nguyen
(74) *Attorney, Agent, or Firm* — Andrew J. Harrington; Marger Johnson

(57) ABSTRACT

Bias tees, according to certain embodiments of the present invention, include switches in the AC signal path, the DC signal path, or both, to improve the capability of the bias tees to be used for high impedance AC measurement, low current DC measurement, or both. Optical control of the switches, as well as control of the switches using a DC bias present within the AC signal input to the bias tee, is described. Including a set of diodes into the DC signal path, rather than a switch, provides enhanced capability of the bias tee to be used for high impedance AC measurements.

13 Claims, 8 Drawing Sheets

(56) References Cited

U.S. PATENT DOCUMENTS

| | | | |
|---|---|---|---|
| 7,012,486 B2* | 3/2006 | Ji | H01F 27/027 |
| | | | 333/181 |
| 8,644,029 B1* | 2/2014 | Ji | H05K 3/3415 |
| | | | 361/763 |
| 9,196,956 B2* | 11/2015 | King | H04B 10/25758 |
| 2003/0124984 A1* | 7/2003 | Shin | H04B 1/406 |
| | | | 455/78 |
| 2004/0114650 A1* | 6/2004 | Tanaka | H01S 5/042 |
| | | | 372/38.02 |
| 2007/0007972 A1 | 1/2007 | Knauer | |
| 2015/0349397 A1* | 12/2015 | Barbieri | H03F 3/193 |
| | | | 330/296 |

* cited by examiner

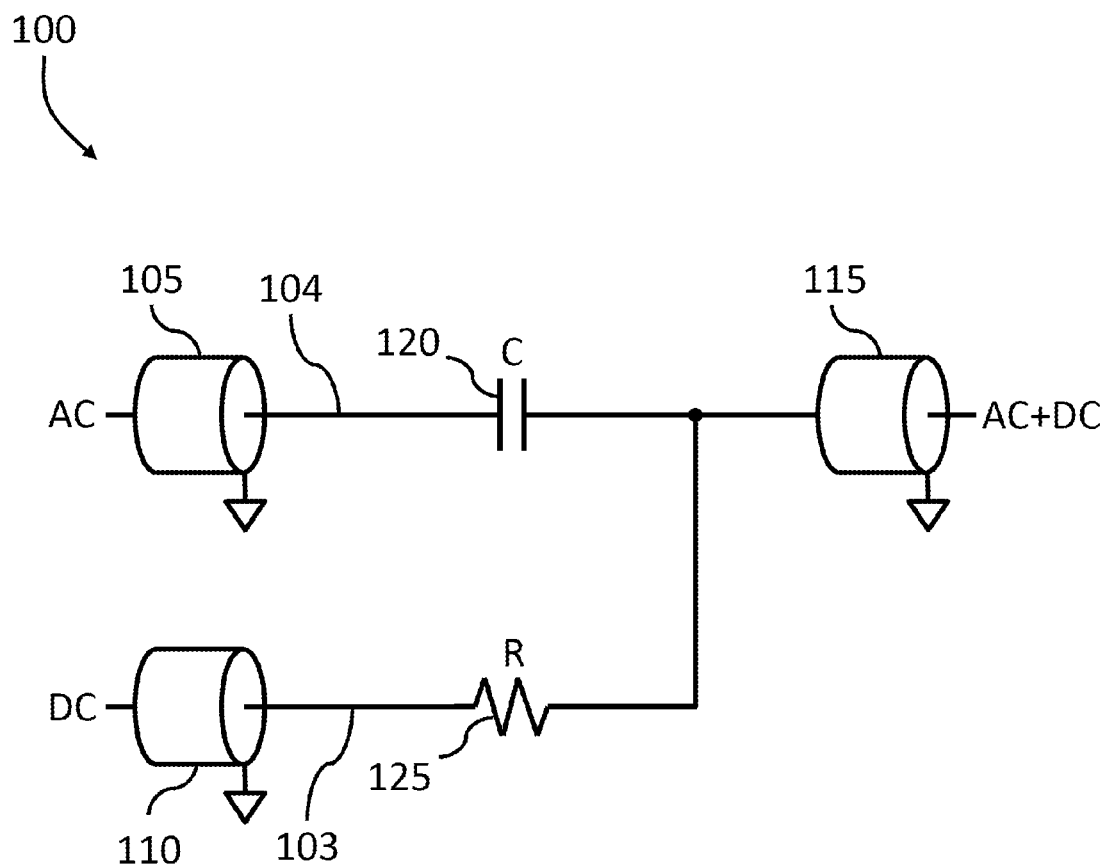
FIG. 1 (conventional)

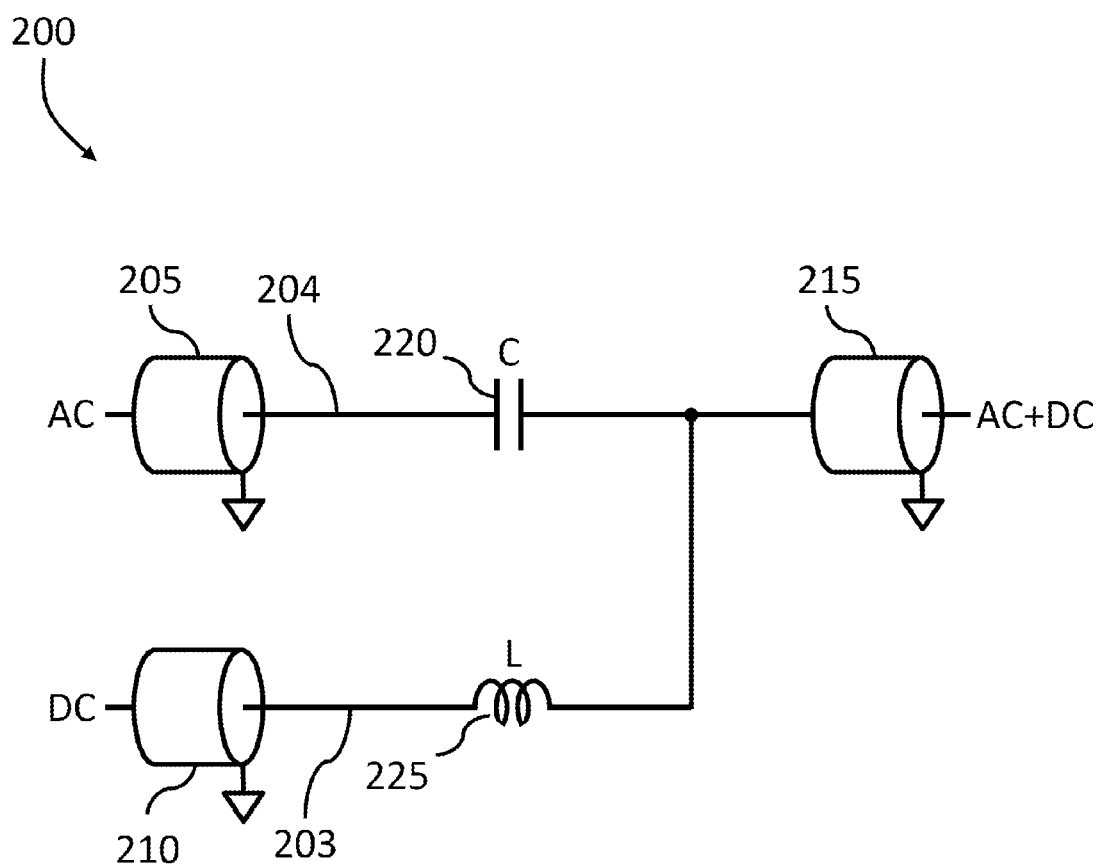
FIG. 2 (conventional)

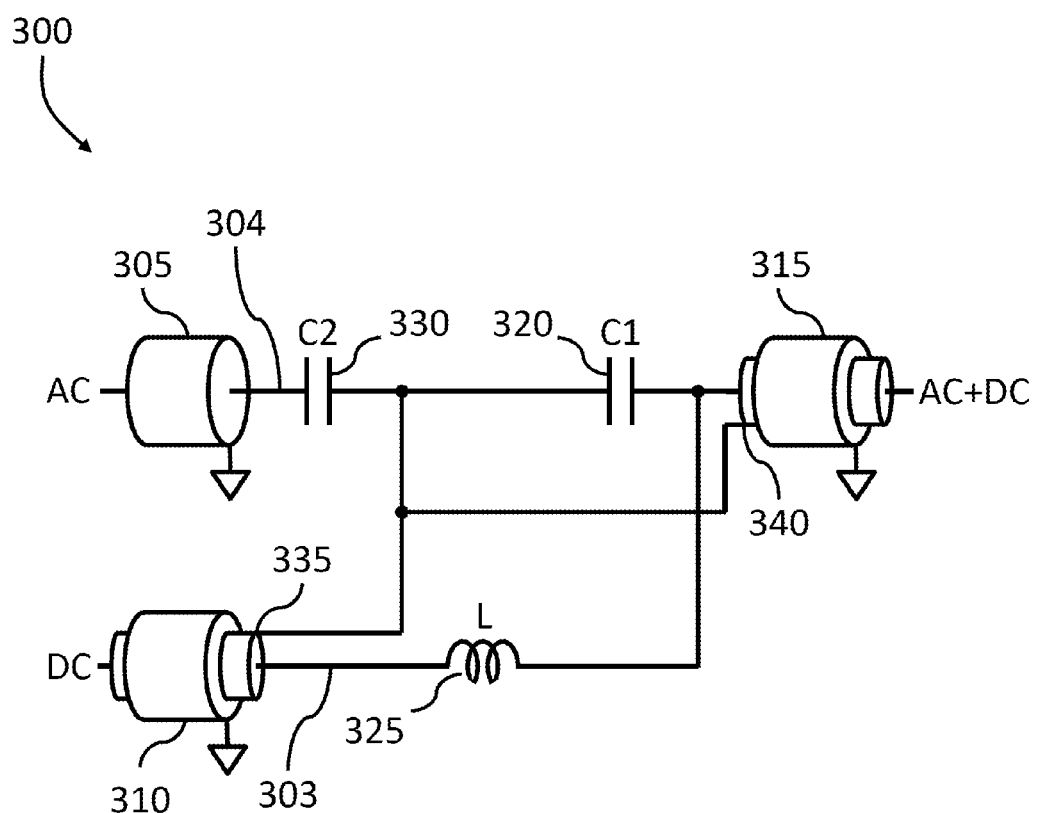
FIG. 3 (conventional)

CONFIGURABLE BIAS TEE

CROSS-REFERENCE TO RELATED APPLICATIONS

This application claims the benefit of U.S. Provisional Patent Application No. 61/955,553 titled "Improved Bias Tee Designs with Extended Low Current Measurement and AC High Impedance Measurement Capability" filed Mar. 19, 2014, which is incorporated by reference herein.

BACKGROUND OF THE INVENTION

Field of the Invention

This disclosure relates to bias tees, and, more particularly to configurable bias tees that improve current processes for low current measurements and AC high impedance measurements.

Description of Related Art

A bias tee is typically a passive, three-port electrical network that may act as a diplexer. In one mode of operation, one port of the bias tee network is connected to a very low frequency or direct current (DC) source and another port is connected to a high frequency or alternating current (AC) source. The bias tee combines the DC source signal and the AC source signal so that the third port of the network is simultaneously coupled to both the DC and AC signals. Bias tees are well-known electrical devices which are useful in many applications where it is necessary to inject DC power into an AC signal. Typical applications include powering photodiodes, lasers, or remote antenna amplifiers.

Bias tees are also typically bi-directional. Therefore, in another mode of operation, a combined AC and DC ("AC+DC") signal is applied to the third port of the tee, and the bias tee network separates the AC and DC components of the signal so that the AC component of the signal can be measured at the AC port of the tee, and the DC component of the signal can be measured at the DC port of the tee. Examples of applications that use a bias tee in this mode include packaged device characterization and wafer probing. In these types of applications, connecting the combined AC+DC port of the tee to the output of the device under test allows a user to measure the DC characteristics of the device, and to measure the AC characteristics of the device, without having to re-configure the test setup between the DC and AC tests. In such applications, for certain types of devices, the bias tee carries very low DC current levels, as well as AC signals for high impedance measurements to the measurement instrument. Achieving good performance for both low current DC measurements and AC high impedance measurements presents special challenges to the designer of a bias tee.

The simplest bias tee designs employ a capacitor, a resistor, and three coaxial connectors. The coaxial connectors serve as a DC signal port, an AC signal port, and a combined AC+DC signal port for the tee. The capacitor is connected between the AC signal port and the AC+DC signal port. The resistor is connected between the DC signal port and the AC+DC signal port. The overall DC performance of this bias tee design is limited because the resistive element limits the current that can travel through the DC path of the tee.

Improved DC performance is achieved with a modified bias tee design in which the resistor in the DC path is replaced with an inductor. Although an ideal inductor would block the AC signal from passing back to the DC port, the AC performance of this design can be limited by the potential LC resonance effects. Also, since such a design uses coaxial connectors as the ports of the tee, its low current performance is limited due to the leakage current inherent in coaxial connectors.

To improve low current performance, triaxial connectors, rather than coaxial connectors, are used for the DC port and the AC+DC port. The single capacitor in the designs described above is replaced with two capacitors in series. One of the capacitors is "guarded" by the DC signal, thereby minimizing the leakage current through this capacitor. However, because this capacitor usually has relatively large capacitance, it will tend to generate current noise, thereby still hampering the low current performance of the bias tee.

Embodiments of the invention address these and other limitations of the prior art.

BRIEF SUMMARY OF THE INVENTION

A configurable bias tee includes an AC signal port, a DC signal port, and an AC+DC signal port. The bias tee has triaxial connectors as the DC signal port and the AC+DC signal port. A first electrical network coupled between the DC signal port and the AC+DC signal port provides a DC signal path through the tee. A second electrical network is coupled between the AC signal port and the AC+DC signal port. The second electrical network includes a first capacitor, a switch, and a second capacitor in series. The second capacitor is "guarded" by the guards of the triaxial DC and AC+DC signal ports. The switch is configured to provide an AC signal path through the tee when closed, and to disconnect the AC path when opened.

Methods of using a configurable bias tee with an AC signal path and a DC signal path include opening either the AC signal path or the DC signal path, and measuring a signal conveyed through the non-opened path at either, respectively, the DC signal port or the AC signal port.

BRIEF DESCRIPTION OF THE SEVERAL VIEWS OF THE DRAWINGS

FIG. 1 is a schematic diagram of a conventional bias tee incorporating coaxial connectors, a capacitor, and a resistor.

FIG. 2 is a schematic diagram of a conventional bias tee incorporating coaxial connectors, a capacitor, and an inductor.

FIG. 3 is a schematic diagram of a conventional bias tee incorporating a coaxial connector, triaxial connectors, a capacitor, and an inductor.

DETAILED DESCRIPTION OF THE INVENTION

Figure 4:
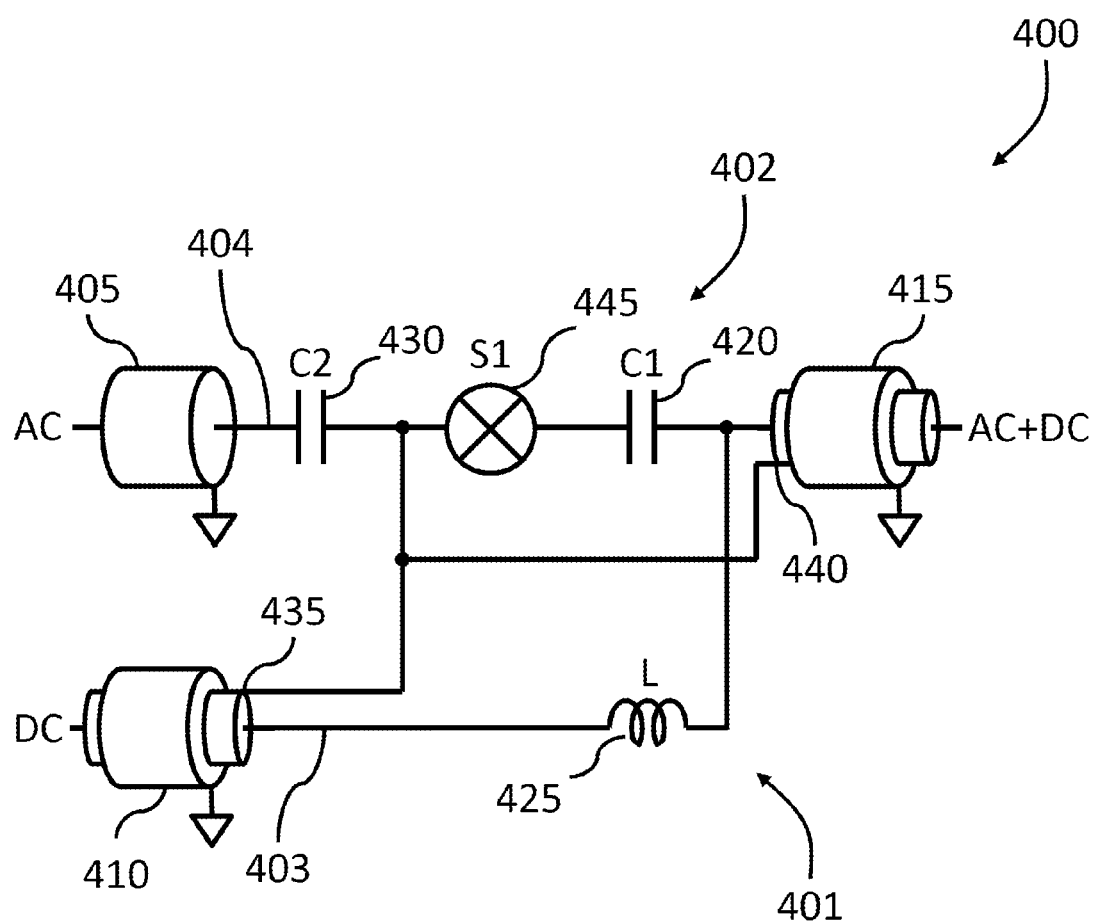
FIG. 4 is a schematic diagram of a bias tee network incorporating a switch into the AC signal path, according to some embodiments of the invention.

FIG. 1 shows a simple conventional bias tee network 100 including a coaxial connector 105 serving as an AC signal port, a coaxial connector 110 serving as a DC signal port, a coaxial connector 115 serving as a combined AC+DC signal port, a capacitor 120 coupled between the AC signal port 105 and the AC+DC signal port 115, and a resistor 125 coupled between the DC signal port 110 and the AC+DC signal port 115. The capacitor couples an AC signal to the AC+DC port, but generally blocks a DC signal from passing back to the AC port, thereby providing an AC signal path 104 through the bias tee. The resistor couples a DC signal to the AC+DC port, thereby providing a DC signal path 103 through the bias tee. As explained above, this type of bias tee allows for generally good AC coupling, but its DC performance is limited by the resistor in the DC signal path.

FIG. 2 shows a conventional bias tee network 200 that offers improved DC performance compared to the bias tee shown in FIG. 1. The bias tee 200 is similar to the bias tee depicted in FIG. 1 except that the resistor in the DC signal path is replaced by an inductor 225. This bias tee design has improved DC performance, because a full range of current can be delivered to an AC+DC signal port 215, assuming the inductor 225 used is physically capable of handling the required current. But, the tradeoff for this improvement in DC performance is a reduction in AC performance due to LC resonance, depending on the selection of a capacitor 220 and the inductor 225. Additionally, the bias tee 200 has limited low current performance due to the physical real-world non-ideal characteristics of the inductor 225, as well as the leakage current inherent in a coaxial DC signal port 210 and the coaxial AC+DC signal port 215.

Another type of conventional bias tee design, a bias tee network 300 depicted in FIG. 3, improves the low current performance of the tee. The design of the bias tee network 300 is similar to the bias tee network depicted in FIG. 2, except that in bias tee network 300, the single capacitor in an AC signal path 304 is replaced with two capacitors in series—a capacitor 320 and a capacitor 330. Like the bias tee network depicted in FIG. 2, a coaxial connector 305 serves as the AC signal port. However, in the bias tee network 300, the connector serving as the DC signal port is a triaxial connector 310, and the connector serving as the AC+DC signal port is a triaxial connector 315. In general, triaxial cables and connectors have an outer shield, a center conducting core known as the force, and an inner shield, known as the guard, between the force and the outer shield. The guard is kept at approximately the same electric potential as the force, thereby minimizing leakage current between the force and the guard.

In the bias tee network 300 of FIG. 3, the capacitors 320, 330 are coupled in series between the center conductor of the AC signal port coaxial connector 305 and the force of the AC+DC signal port triaxial connector 315, thereby providing the AC path 304 through the bias tee 300. An inductor 325 is coupled between the force of the DC signal port triaxial connector 310 and the force of the AC+DC signal port triaxial connector 315, providing a DC path 303 through the bias tee 300. A guard 335 of the DC signal port is connected to a guard 340 of the AC+DC signal port 315, and also to the node between the capacitors 320, 330. In this configuration, low current performance of the bias tee 300 is better than that of the bias tee depicted in FIG. 2. Because the guard 335 voltage follows the DC signal voltage, the capacitor 320 has 0 V across it. Therefore, the leakage current through the capacitor 320 is minimized, which improves the overall low current measurement capability of the bias tee 300. However, because the capacitor 320 typically has a relatively large capacitance, the low current measurement capability of the bias tee 300 is still limited due to current noise resulting from the presence of the large capacitor 320 between the guard 335 and the DC signal.

FIG. 4 illustrates a configurable bias tee network 400 according to an embodiment of the invention. The bias tee network 400 includes a connector 405 serving as an AC signal port, a triaxial connector 410 serving as a DC signal port, and a triaxial connector 415 serving as an AC+DC signal port. The bias tee network 400 is bi-directional. The AC signal port connector 405 is typically a coaxial connector. The DC signal port and the AC+DC signal port triaxial connectors 410, 415 each have a force and a guard. The DC signal port guard 435 is connected to the AC+DC signal port guard 440.

The bias tee network 400 has a first electrical network 401 coupled between the force of the DC signal port 410 and the force of the AC+DC port 415 to provide a DC path 403 between these two ports of the bias tee 400. In the bias tee network 400 of FIG. 4, the electrical network 401 includes an inductor 425. The bias tee network 400 also has a second electrical network 402 coupled between the force of the AC+DC signal port 415 and the center conductor of the AC signal port 405. This second electrical network 402 includes a capacitor 420, a switch 445, and a capacitor 430 coupled in series. The capacitor 430 is coupled between the center conductor of the AC signal port 405 and the guards 435, 440. The capacitor 420 and the switch 445 are coupled in series between the force of the AC+DC signal port 415 and the guards 435, 440. With the switch 445 closed, the electrical network 402 provides an AC path 404 through the bias tee 400 between the AC signal port 405 and the AC+DC signal port 415. With the switch 445 open, the AC path 404 is decoupled, or otherwise disconnected.

With the switch 445 closed, the capacitor 420 is said to be "guarded by" the DC signal in the DC path 401 through the bias tee 400. That is, because the voltage at the guard 435 follows the voltage at the force of the DC signal port 410, there is 0 V across the capacitor 420, thereby minimizing the leakage current through the capacitor 420. However, with the switch 445 closed, the performance of the bias tee network 400 when measuring DC low currents may still be negatively impacted by current noise. Current noise may be generated because the capacitor 420 typically has a relatively large capacitance. Preferably, the switch 445 is designed or selected such that, when open, the parasitic capacitance of the switch 445 is much lower than the capacitance of the capacitor 420. Therefore, by opening the switch 445, the AC path 404 is disconnected and current noise is reduced, thereby improving the performance of the bias tee network 400 when used for low current measurements.

Figure 5:
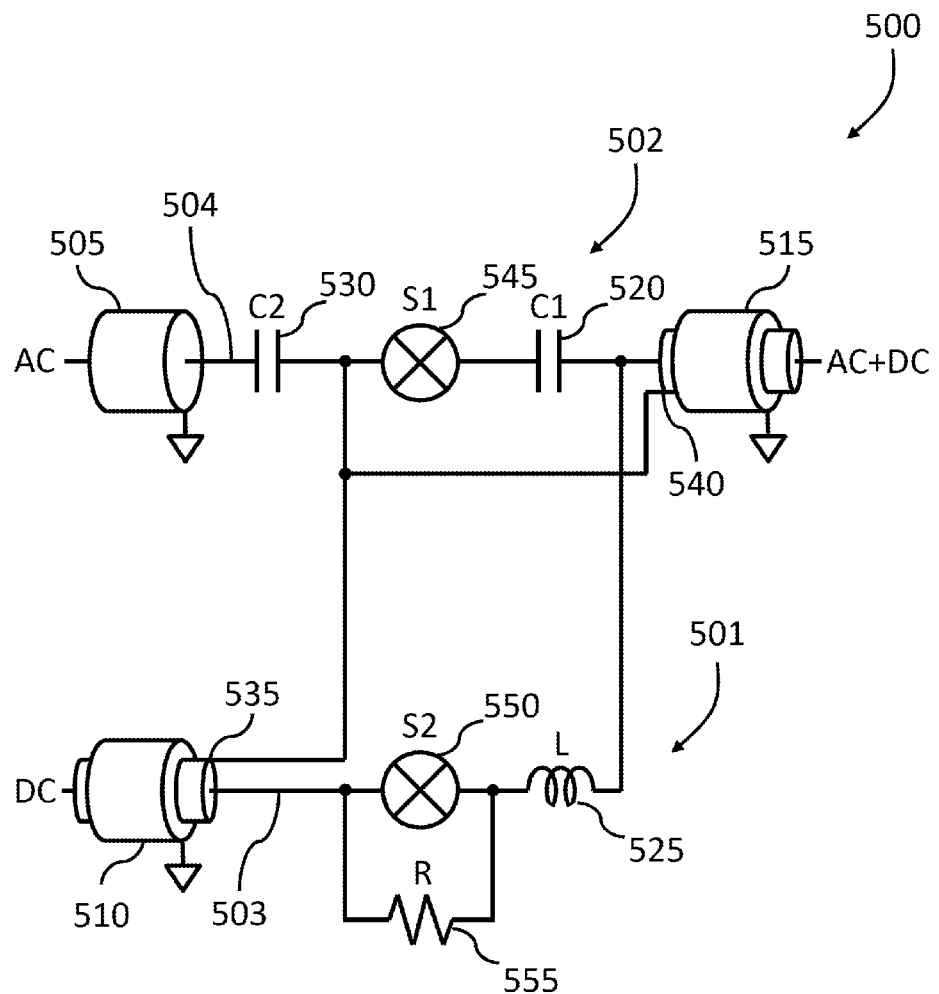
FIG. 5 is a schematic diagram of a bias tee network incorporating switches into the AC signal path and the DC signal path, according to some embodiments of the invention.

FIG. 5 illustrates a configurable bias tee network 500 according to another embodiment of the invention. Like the bias tee network 400 depicted in FIG. 4, the bias tee 500 of FIG. 5 has an electrical network 502 coupled between the force of an AC+DC signal port triaxial connector 515 and the center conductor of an AC signal port 505. The electrical network 502 includes a switch 545 that, when closed, provides an AC signal path 504 through the bias tee 500, and that, when opened, disconnects the AC path 504 to effect a performance improvement for low current measurement applications by reducing current noise that may be generated by a capacitor 520.

The bias tee 500 also has an electrical network 501 coupled between the force of the AC+DC signal port triaxial connector 515 and the force of a DC signal port triaxial connector 510. The electrical network 501 includes an inductor 525 and a switch 550 coupled in series such that when the switch 550 is closed, the electrical network 501 provides a DC signal path 503 through the bias tee 500. Opening the switch 550 creates a high impedance in the DC path 503, thereby improving the performance of the bias tee 500 for high impedance AC measurements. A resistor 555 is coupled in parallel with the switch 550 to enable the bias tee 500 to still have some reduced current DC bias capability even when the switch 550 is open.

In operation, one method of using the bias tee 500 includes opening either the DC path 503, or the AC path 504, and then measuring a signal conveyed through the non-opened path. Measurements may be made at, respectively, the AC signal port 505, or the DC signal port 510, for example. Opening the DC path 503 may include opening the switch 550. The switch 550 may be opened in response to a generated DC path switch control signal Likewise, opening the AC path 504 may include opening the switch 545. The switch 545 may be opened in response to a generated AC path switch control signal.

Both the switches 545, 550 are preferably designed or selected to be switches with very low leakage current. One design consideration is the specified impedance of the switch. For example, if the switch has a specified impedance of 1 GΩ from control to output, at 100 V, a current of 100 nA will flow to the output. Such a leakage current may be unacceptable for the bias tee 500 to be used for low current measurements. In practice, it may be difficult to include switches that enclose control and switch circuitry into one package, and that also have acceptably low enough leakage current. Therefore, the switches 545, 550 are preferably designed or selected to be switches that have the control and switch circuitry separated and isolated, such as, for example, switches that are optically controlled.

Figure 6:
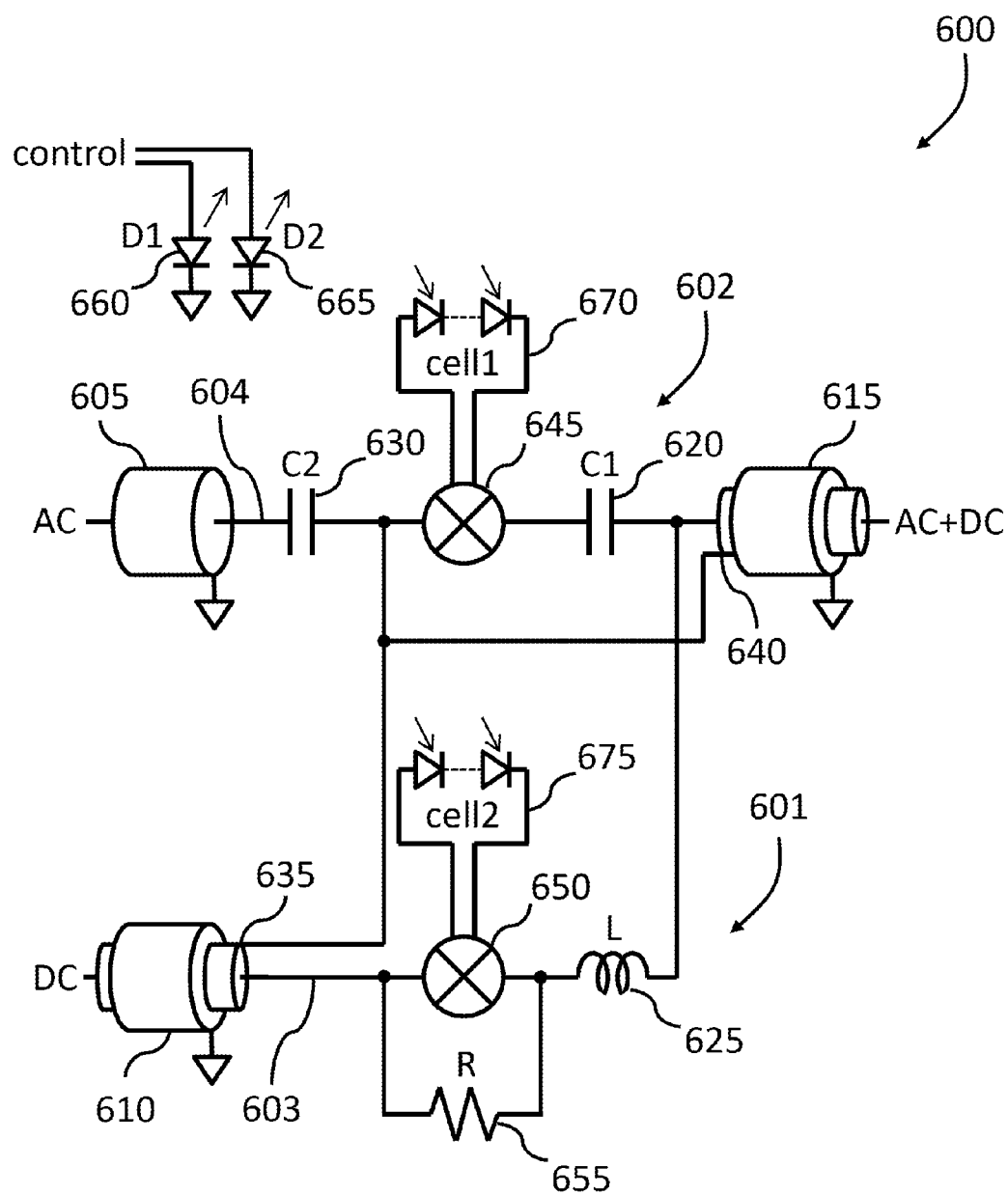
FIG. 6 is a schematic diagram of a bias tee network incorporating switches into the AC signal path and the DC signal path, with isolated control circuitry for the switches, according to some embodiments of the invention.

FIG. 6 shows a configurable bias tee network 600 according to another embodiment of the invention. The bias tee 600 is similar to the bias tee 500 shown in FIG. 5, except that in the bias tee 600, a switch 645 in an AC signal path 604 is activated by a photocell 670, and a switch 650 in a DC signal path 603 is activated by a photocell 675. The photocell 670 responds to an isolated control circuit 660 and the photocell 675 responds to an isolated control circuit 665. The output of control circuits 660, 665 may include, for example, light from light-emitting diodes (LEDs). Preferably, the control circuits 660, 665 are insulated from the respective photocells 670, 675 by a very high impedance material, such as, for example, air. In some embodiments, a single control signal may be input to both control circuits 660, 665.

In operation, generating an output from the control circuits 660, 665 may be used to control the switches 645, 650, respectively. Generating an output from control circuits 660, 665 may include generating a DC bias voltage.

Figure 7:
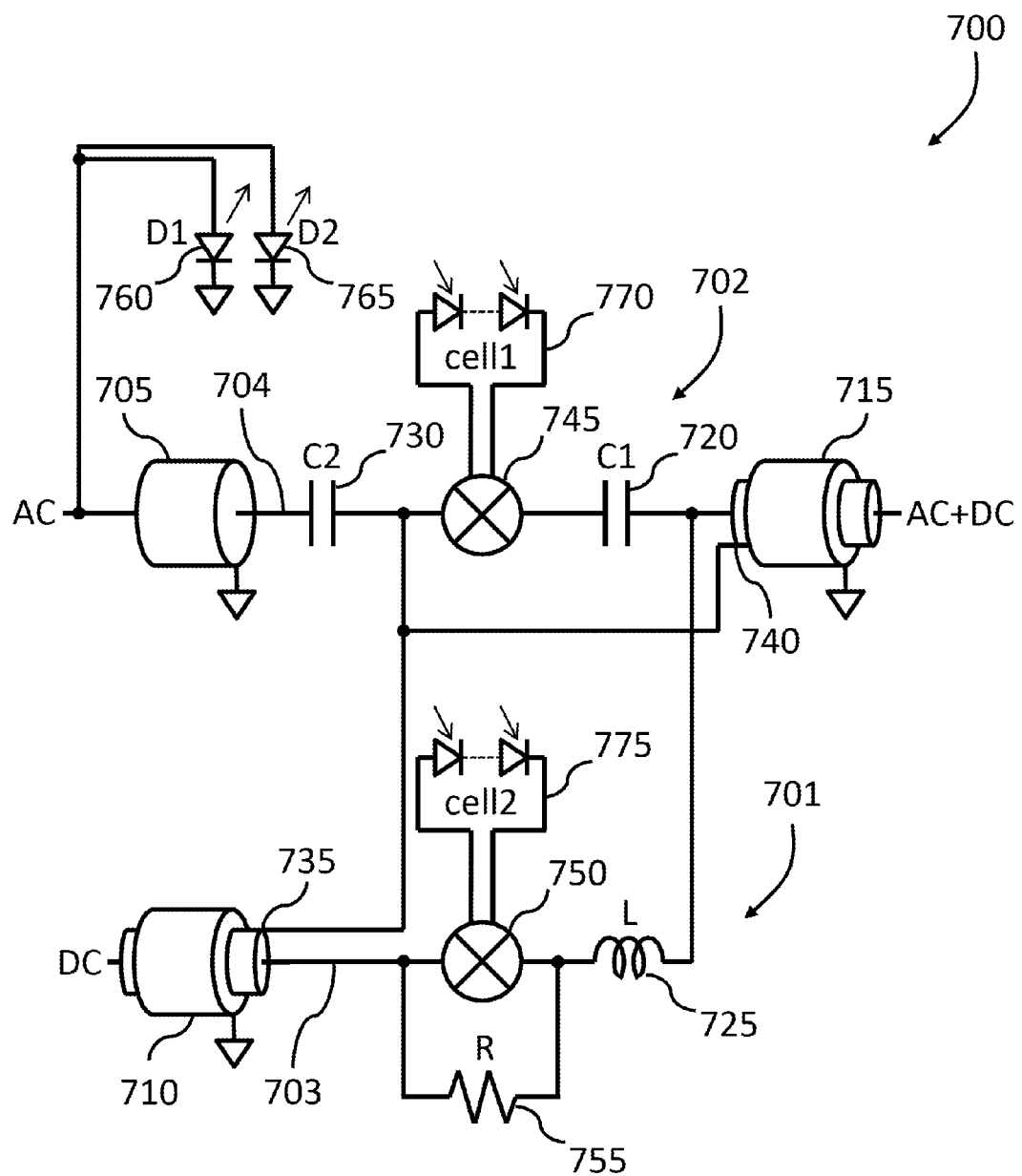
FIG. 7 is a schematic diagram of a bias tee network incorporating switches into the AC signal path and the DC signal path, with control circuitry for the switches being driven by the AC signal, according to some embodiments of the invention.

FIG. 7 illustrates a configurable bias tee network 700, according to another embodiment of the invention, providing self-contained switch control. The structure of the bias tee 700 is similar to the bias tee 600 shown in FIG. 6, except that in the bias tee 700, the inputs of control circuits 760, 765 are coupled to the input of an AC signal port 705. Because an AC signal (not shown) input to the AC signal port 705 is AC-coupled to the bias tee 700, and because the AC signal may have its own DC bias level, controlling this DC bias level may be used to selectively drive the control circuits 760, 765. Although the control circuits 760, 765 are illustrated in FIG. 7 as LEDs, the control circuits 760, 765 may be designed and arranged in a variety of different configurations to effect different switch control logic for the photocells 770, 775, activating, respectively, the switches 745, 755. Preferably, the current needed to drive the control circuits 760, 765 is relatively low, so that the impedance of the control circuits does not interfere with the measurements for which the bias tee 700 is used. Additionally, in the case where the control circuits 760, 765 are LEDs, these LEDs are preferably optically isolated from each other, so as to prevent crosstalk.

Figure 8:
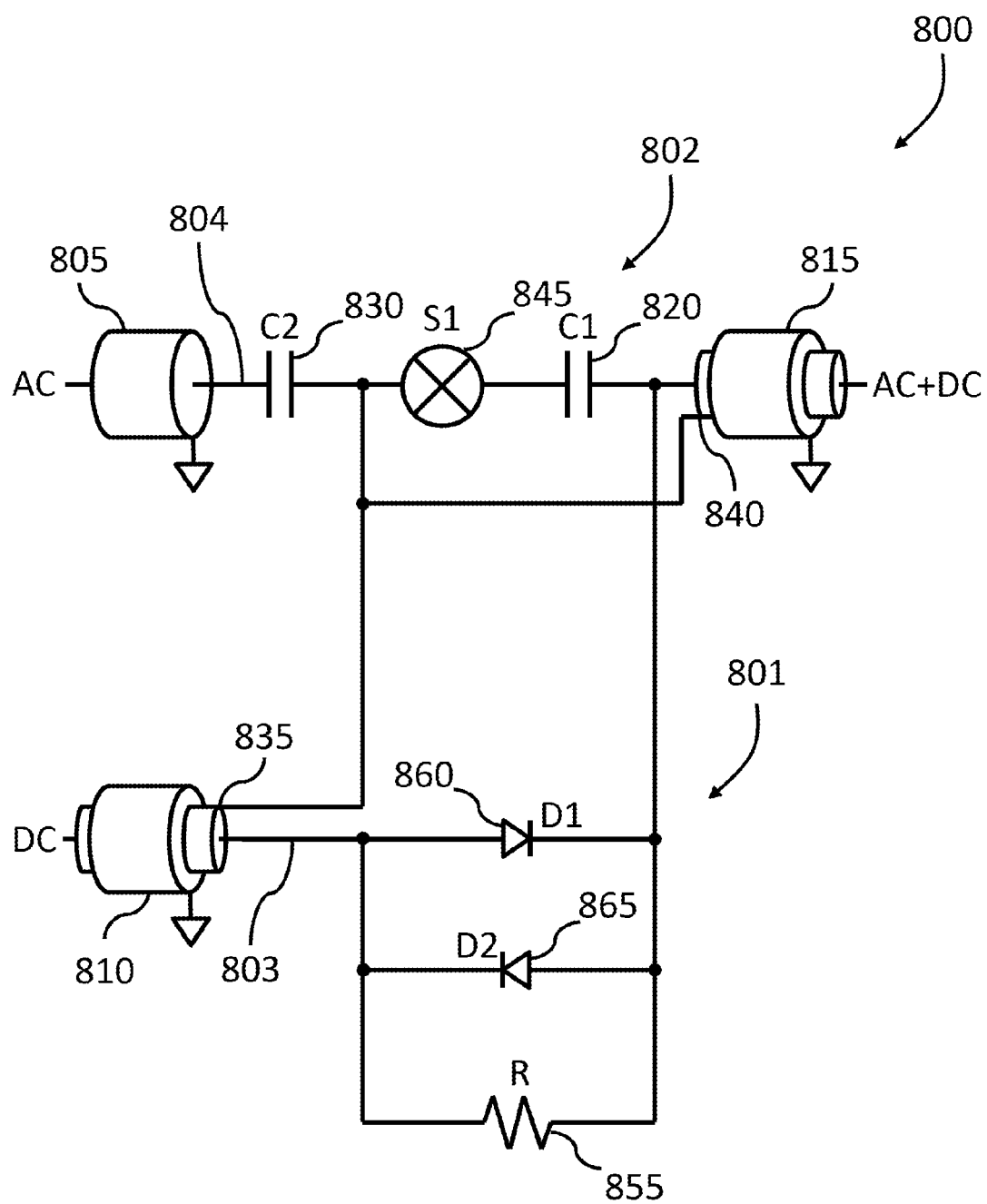
FIG. 8 is a schematic diagram of a bias tee network incorporating a switch into the AC signal path, and diodes into the DC signal path, according to some embodiments of the invention.

Finally, FIG. 8 illustrates a configurable bias tee network 800, according to another embodiment of the invention. The bias tee 800 is similar to bias tee 500 depicted in FIG. 5 in that the bias tee 800 of FIG. 8 has an electrical network 802—including a capacitor 820, a switch 845 and a capacitor 830 coupled in series—coupled between the force of an AC+DC signal port triaxial connector 815 and the center conductor of an AC signal port 805. The capacitor 830 is guarded by a guard 835 of a DC signal port triaxial connector 810 and a guard 840 of the AC+DC signal port triaxial connector 815. The switch 845 is arranged to provide an AC signal path 804 through the bias tee 800 when closed, and to disconnect the AC signal path 804 when opened.

The bias tee 800 also has an electrical network 801 coupled between the force of the DC signal port 810 and the force of the AC+DC signal port 815, providing a DC signal path 803 through the bias tee 800. The electrical network 801 includes a pair of diodes 860, 865 and a resistor 855 coupled in parallel. The diodes 860, 865 are coupled in opposite polarity to each other. This configuration gives the bias tee 800 improved AC high impedance measurement capability when DC signal current is low, but also allows the bias tee 800 to supply a high DC bias current with a reduction in AC high impedance measurement capability. Preferably, the DC drop though diodes 860 and 865 is calibrated out in the measurement system (not shown) in which the bias tee 800 is used, or remote sense capability is added to correct for the drop. Other embodiments of the invention add remote sense capability to the bias tees 400, 500, 600, and 700, described above.

It will be appreciated from the forgoing discussion that the invention provides significant advances in bias tee performance. Although specific embodiments of the invention have been illustrated and described for purposes of illustration, it will be understood that various modifications may be made without departing from the spirit and scope of the invention. Accordingly, the invention should not be limited except as by the appended claims.

What is claimed is:

1. A configurable bias tee network having an AC signal port, a triaxial DC signal port having a guard, and a triaxial AC+DC signal port having a guard, comprising:
   a first electrical network coupled between the DC signal port and the AC+DC signal port, the first electrical network providing a DC path between the DC signal port and the AC+DC signal port; and
   a second electrical network coupled between the AC signal port and the AC+DC signal port, the second electrical network including a first capacitor, a first switch, and a second capacitor connected in series, and the second electrical network providing an AC path between the AC signal port and the AC+DC signal port when the first switch is closed, and disconnecting the AC path when the first switch is opened;

in which the guard of the DC signal port is connected to the guard of the AC+DC signal port, and in which the first capacitor and the first switch are series coupled between the guards and the AC+DC signal port.

2. The bias tee network of claim 1 in which the first switch has a lower capacitance than the capacitance of the first capacitor when the first switch is open.

3. The bias tee network of claim 1 in which the first electrical network comprises an inductor.

4. The bias tee network of claim 1 in which the first electrical network comprises a resistor connected in parallel with two diodes coupled in opposite polarity.

5. The bias tee network of claim 1 in which the first electrical network comprises an inductor connected in series with a second switch, structured to maintain the DC path when the second switch is closed, and to present a high impedance in the DC path when the second switch is opened.

6. The bias tee network of claim 5, further comprising:
a resistor connected in parallel with the second switch, the resistor value selected to allow a controllable amount of current through the DC path when the second switch is open.

7. The bias tee network of claim 5 in which at least one of the first and second switches has a leakage current of less than 1 pA.

8. The bias tee network of claim 5 in which at least one of the first and second switches comprises an optically controlled switch.

9. The bias tee network of claim 5, further comprising:
a first control circuit configured to control the first switch; and
a second control circuit configured to control the second switch.

10. The bias tee network of claim 9 in which at least one of the first and second control circuits comprises an optically-isolated light emitting diode.

11. The bias tee network of claim 10 in which the optically-isolated light emitting diode is insulated by air from its respective optically controlled switch.

12. The bias tee network of claim 11 in which at least one of the first and second control circuits is controllable by applying a DC bias voltage to the AC signal port.

13. The bias tee network of claim 12 in which applying a first DC bias voltage to the AC signal port causes the first control circuit to open the first switch and the second control circuit to close the second switch, and applying a second DC bias voltage to the AC signal port causes the first control circuit to close the first switch and the second control circuit to open the second switch.

* * * * *